United States Patent

Meyer (10) Patent No.: US 9,164,404 B2
(45) Date of Patent: Oct. 20, 2015

(54) SYSTEM AND PROCESS FOR FABRICATING SEMICONDUCTOR PACKAGES

(75) Inventor: Thorsten Meyer, Regensburg (DE)

(73) Assignee: Intel Corporation, Santa Clara, CA (US)

(*) Notice: Subject to any disclaimer, the term of this patent is extended or adjusted under 35 U.S.C. 154(b) by 1275 days.

(21) Appl. No.: 12/234,259

(22) Filed: Sep. 19, 2008

(65) Prior Publication Data

US 2010/0073663 A1    Mar. 25, 2010

(51) Int. Cl.
| | |
|---|---|
| H01L 23/00 | (2006.01) |
| G03F 7/20 | (2006.01) |
| G03F 9/00 | (2006.01) |
| H01L 21/56 | (2006.01) |

(52) U.S. Cl.
CPC .......... *G03F 7/70991* (2013.01); *G03F 9/7003* (2013.01); *G03F 9/7011* (2013.01); *H01L 24/19* (2013.01); *H01L 24/95* (2013.01); *H01L 24/96* (2013.01); *H01L 21/568* (2013.01); *H01L 2224/12105* (2013.01)

(58) Field of Classification Search
CPC ................................ H01L 24/96; H01L 24/95
USPC ..................... 438/16, 708, 709; 257/E21.027
See application file for complete search history.

(56) References Cited

U.S. PATENT DOCUMENTS

| | | | |
|---|---|---|---|
| 5,144,747 A | | 9/1992 | Eichelberger |
| 5,705,320 A | * | 1/1998 | Hsu et al. ................. 430/313 |
| 5,869,383 A | * | 2/1999 | Chien et al. .............. 438/401 |
| 5,972,798 A | * | 10/1999 | Jang et al. ................. 438/717 |
| 6,084,778 A | | 7/2000 | Malhi |
| 6,356,453 B1 | | 3/2002 | Juskey et al. |
| 6,372,527 B1 | | 4/2002 | Khandros et al. |
| 6,495,912 B1 | | 12/2002 | Huang et al. |
| 6,546,620 B1 | | 4/2003 | Juskey et al. |
| 6,790,759 B1 | | 9/2004 | Wang et al. |
| 6,825,559 B2 | | 11/2004 | Mishra et al. |
| 7,060,525 B1 | | 6/2006 | Tilly |
| 7,166,917 B2 | | 1/2007 | Yang et al. |
| 7,185,426 B1 | | 3/2007 | Hiner et al. |
| 7,202,560 B2 | | 4/2007 | Dungan et al. |

(Continued)

FOREIGN PATENT DOCUMENTS

| | | |
|---|---|---|
| DE | WO 00/04577 | 1/2000 |
| DE | 102004033057 A1 | 6/2005 |

(Continued)

OTHER PUBLICATIONS

"An Embedded Device Technology Based on a Molded Reconfigured Wafer," Electronic Components and Technology Conference, 2006. Proceedings. 56th Volume, May 30, 2006, (5 pages).

(Continued)

*Primary Examiner* — Amar Movva
(74) *Attorney, Agent, or Firm* — Blakely, Sokoloff, Taylor & Zafman LLP (57) ABSTRACT

A method of processing semiconductor chips includes measuring locations of semiconductor dies placed on a carrier with a scanner to generate die location information, and communicating the die location information to a photolithographic stepper. The method includes aligning the photolithographic stepper with the carrier only one time, and exposing at least one of the dies on the carrier with the photolithographic stepper based on the die location information generated by the scanner.

23 Claims, 10 Drawing Sheets

(56) References Cited

U.S. PATENT DOCUMENTS

| | | |
|---|---|---|
| 7,208,824 B2 | 4/2007 | Lee et al. |
| 8,555,494 B2 | 10/2013 | Jomaa |
| 2002/0114143 A1 | 8/2002 | Morrison et al. |
| 2002/0153616 A1 | 10/2002 | Kunihisa et al. |
| 2003/0124868 A1 | 7/2003 | Mizukoshi |
| 2004/0049912 A1 | 3/2004 | Akagawa et al. |
| 2005/0004604 A1 | 1/2005 | Liebler |
| 2005/0023664 A1 | 2/2005 | Chudzik et al. |
| 2005/0067716 A1 | 3/2005 | Mishra et al. |
| 2005/0173786 A1 | 8/2005 | Huang |
| 2005/0194687 A1* | 9/2005 | Yamaguchi .................. 257/738 |
| 2006/0160346 A1 | 7/2006 | Hori |
| 2006/0245308 A1 | 11/2006 | Macropoulos et al. |
| 2006/0263937 A1 | 11/2006 | Fukase et al. |
| 2007/0045575 A1 | 3/2007 | Bruland |
| 2007/0063721 A1 | 3/2007 | Dozier, II et al. |
| 2008/0054445 A1 | 3/2008 | Chiu et al. |
| 2009/0020864 A1 | 1/2009 | Pu et al. |

FOREIGN PATENT DOCUMENTS

| | | |
|---|---|---|
| DE | 102004055037 A1 | 5/2006 |
| DE | 102006032251 A1 | 1/2008 |
| JP | 07086612 A | 3/1995 |

OTHER PUBLICATIONS

"Taking Wafer Level Packaging to the Next Stage: A 200 mm Silicon Technology Compatible Embedded Device Technology," Advanced Packaging Conference, SEMICON Europa 2006, Munich, Germany, Apr. 4, 2006 (17 pages).

* cited by examiner

SYSTEM AND PROCESS FOR FABRICATING SEMICONDUCTOR PACKAGES

BACKGROUND

Semiconductor chips include contact pads on one or more surfaces. Semiconductor packages may include one or more of the chips encapsulated in an electrically non-conducting material. External contact elements of the package are electrically connected to the contact pads of the chip. The contact pads of the chips are generally small. For example, some contact pads are square having a side dimension of about 60 micrometers. The known connection technologies have limits making it time consuming (and thus expensive) to accurately connect the external contact elements to the contact pads. In addition, the position or location of the contact pads for certain packaging technologies can shift as the chips are picked/placed and encapsulated, which has the potential to negatively affect the electrical connection between the external contact elements of the package and the contact pads.

For these and other reasons there is a need for the present invention.

SUMMARY

Embodiments provide a method of processing semiconductor chips. The method includes measuring locations of semiconductor dies placed on a carrier with a scanner to generate die location information, and communicating the die location information to a photolithographic stepper. The method includes aligning the photolithographic stepper with the carrier only one time, and exposing at least one of the dies on the carrier with the photolithographic stepper based on the die location information generated by the scanner.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Embodiments provide a system and method for expediting processing of semiconductor chips. The system and method employ a scanner to generate die location information for semiconductor dies placed on a carrier and pass the die location information on the a photolithographic stepper. The photolithographic stepper is aligned with the carrier only once prior to exposing the semiconductor dies and forming openings that communicate with conductive portions of the dies.

Embodiments of the system and methods provided in this specification are applicable to the fabrication of any semiconductor package style, including embedded wafer level ball grid array packages (eWLB), redistributed chip packages (RCP), or other package styles.

Embodiments provide a process for quickly locating positions of semiconductor dies that have been redistributed onto a carrier and accurately photolithographically opening contact pads on the dies. In one embodiment, semiconductor dies are fabricated on a wafer, singulated, and placed on a carrier subsequent to being electrically isolated with mold material. The redistributed semiconductor dies have variations in the position of their placements such that one semiconductor die might be rotated or translated out of alignment with a neighboring semiconductor die. Embodiments provided herein enable the measurement/calculation of die locations for each of the redistributed semiconductor dies. The die positions are communicated to a photolithographic stepper that aligns itself only one time prior to photolithographically exposing areas above the contact pads of the dies.

Fabricating semiconductor dies, such as dies in embedded wafer level packages, according to the embodiments described herein provides improve electrical connection with higher throughput in less processing time.

Figure 1:
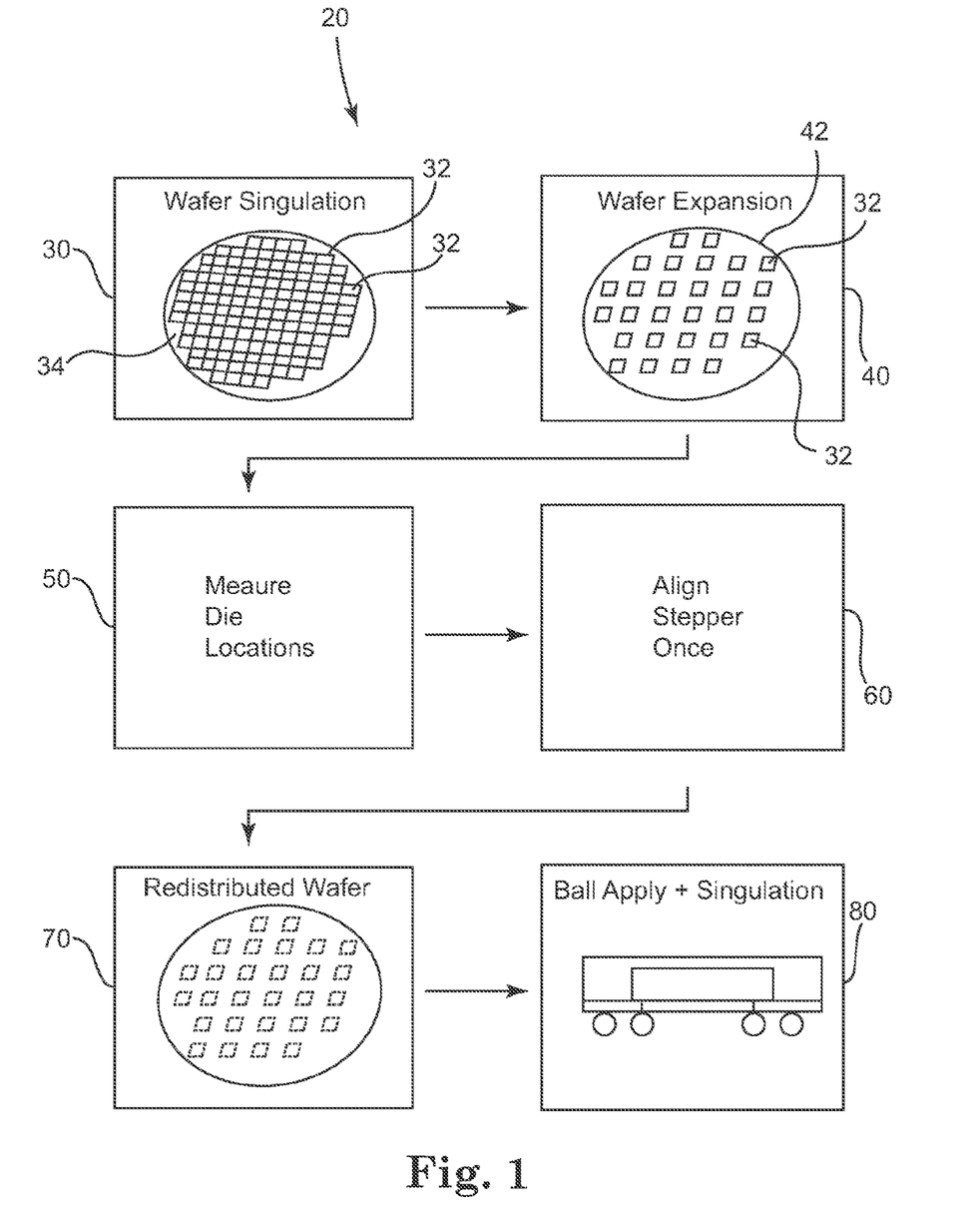
FIG. 1 is a schematic view of a process for fabricating semiconductor chips according to one embodiment.

FIG. 1 is a schematic view of a process 20 for fabricating semiconductor dies according to one embodiment. Process 20 includes at 30 singulating semiconductor chips 32 (or dies 32) from a wafer 34. At 40, dies 32 are placed on a carrier 42 to form a reconfigured wafer 42 with dies 32 in a fan-out pattern in which one die 32 is spaced apart from a neighboring die 32. Picking and placing dies 32 onto carrier 42 has the potential to misalign, misplace, rotate, or translate the dies 32 out of uniform alignment. The variation in the alignment can be small, even on the order of several micrometers, and still undesirably affect electrical connection and electrical performance of the dies. Consequently, it is desirable to determine the position of each die or smaller groups of dies prior to opening the contact pads on the dies 32 for electrical connection. At 50, the location of each die 32 on carrier 42 is measured. In one embodiment, the die locations are measured optically and stored in an electronic or digital format. At 60, a photolithographic stepper is aligned with carrier 42 only one initial time based on the measured location of the dies 32 or alignment marks. The photolithographic stepper exposes the dies 32 to form openings to contact pads on the dies 32. At 70, the redistributed dies have been opened and are prepared for subsequent electrical connection. At 80, one or more connections or other layers, for example redistribution layers, are patterned on the dies. In one embodiment, solder ball interconnects are electrically connected to redistribution layer(s) patterned over the dies with the scanner and the photolithographic stepper.

FIGS. 2a-2e provides multiple schematic cross-sectional views of one embodiment of semiconductor dies 32 redistributed on carrier 42.

Figure 2A:
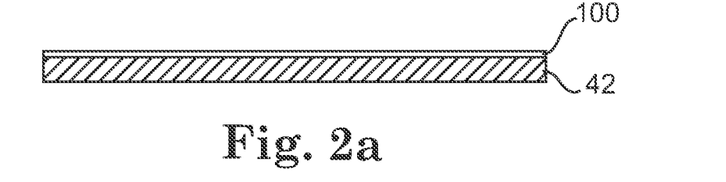
FIGS. 2a-2e illustrate multiple schematic cross-sectional views of the fabrication of semiconductor packages according to one embodiment.

FIG. 2a provides a cross-sectional view of carrier 42 including an adhesive layer 100. In one embodiment, carrier 42 is a reusable metal carrier in the form of a circular plate having a diameter between approximately 100-500 mm. One suitable carrier 42 is a 200 mm metal disc. In on embodiment, adhesive layer 100 is a double-sided adhesive layer, although other adhesive and/or attachment forms are also acceptable.

Figure 2B:
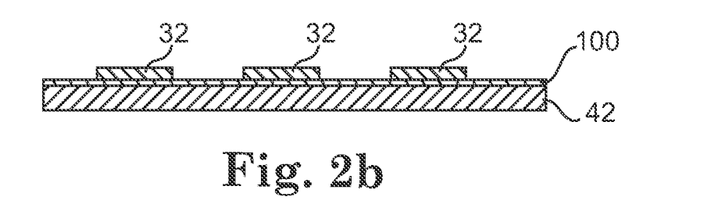

FIG. 2b illustrates semiconductor dies 32 picked and placed in contact with adhesive layer 100 on carrier 42. Picking and placing dies 32 onto carrier 42 has limited accuracy, for example the positional variation in the placement of dies 32 is plus/minus 15 micrometers at times.

Figure 2C:
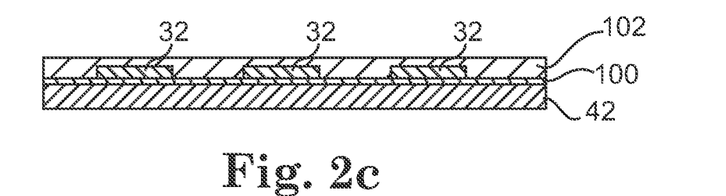

FIG. 2c is a cross-sectional view of mold material 102 encapsulated over dies 32. In one embodiment, mold material 102 is encapsulated over semiconductor dies 32 in a transfer molding process. In one embodiment, mold material 102 is encapsulated over dies 32 in a compression molding process. Mold material 102 includes polymer material, epoxies, or other suitable insulating and/or dielectric materials. Encapsulating dies 32 with mold material 102 will also tend to shift or non-uniformly displace the location of dies 32 on carrier 42.

Figure 2D:
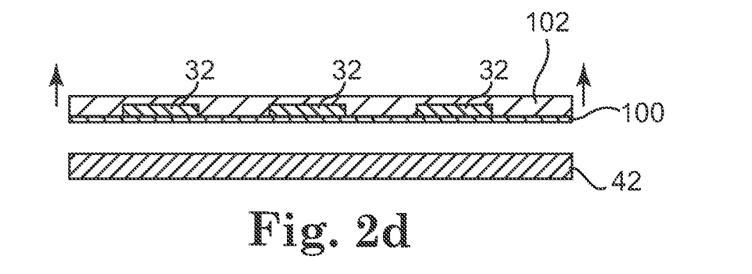

FIG. 2d illustrates dies 32 encapsulated in mold material 102 separated from carrier along the adhesive layer 100 interface. In one embodiment, carrier 42 is removed and reused.

Figure 2E:
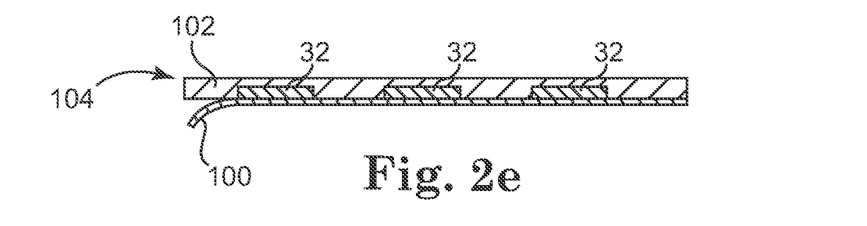

FIG. 2e illustrates adhesive layer 100 removed from dies 32 and mold material 102 to provide a molded reconfigured wafer 104. In on embodiment, molded reconfigured wafer 104 is a 200 mm wafer including dies 32 embedded in mold material 102 and suitable for post-processing to include an electrical redistribution layer and solder ball second level interconnects.

Figure 3:
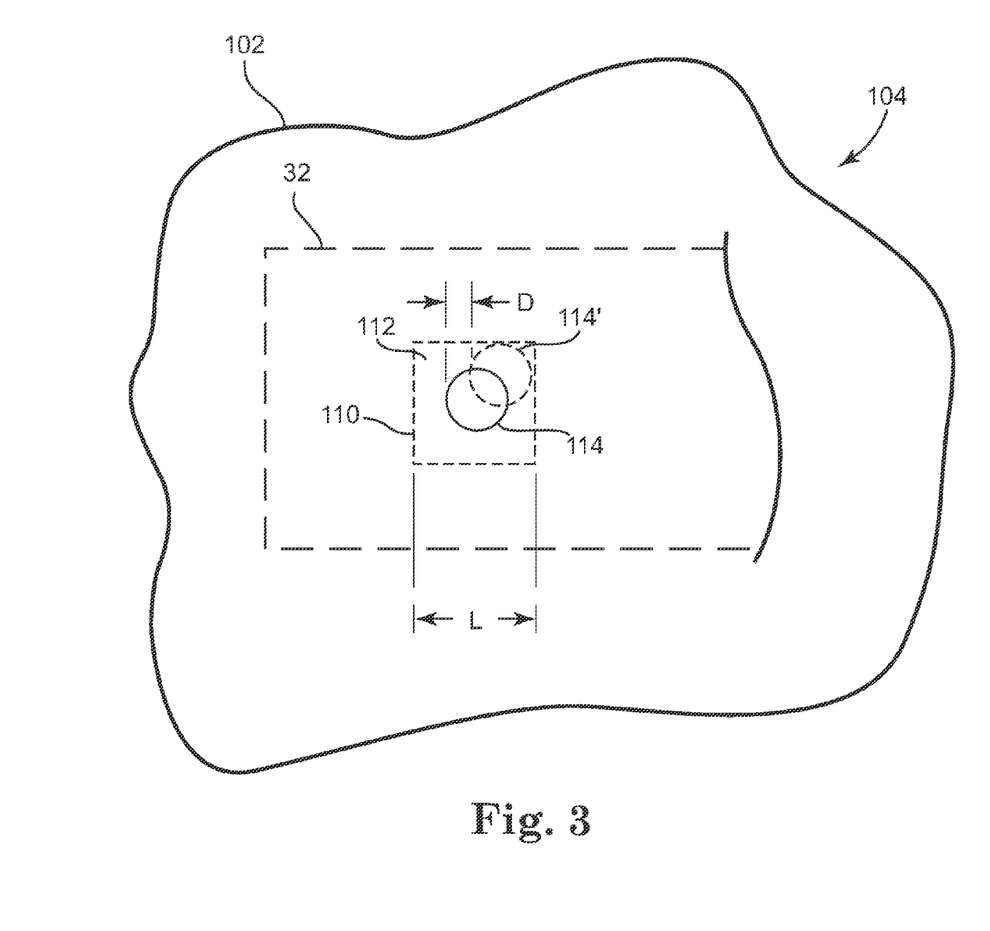
FIG. 3 is a top view of an opening formed in a dielectric layer above a conducting pad of a die according to one embodiment.

FIG. 3 is a top view of reconfigured wafer 104. Semiconductor die 32 is embedded in mold material 102 and includes a contact pad 110 covered by dielectric material 112. It is desirable to form an opening 114 through dielectric material 112 to provide an electrical communication path to contact pad 110. In one embodiment, opening 114 is formed with a photolithographic mask and exposure process.

As described above, die 32 has the potential to be misaligned when placed on carrier 42 (FIG. 2b) and when encapsulated by mold material 102 (FIG. 2c). The misalignment of die 32 has the potential to cause opening 114 to at least partly not align with contact pad 110. For example, in one embodiment contact pad 110 is provided as a square contact pad with a dimension of 64 micrometers on a side, and opening 114 is a substantially circular opening with a diameter of about 20 micrometers. Thus, the maximum tolerable displacement D for the desired opening 114' is about 22 micrometers. If the desired opening 114' is located outside of the maximum tolerable displacement D (i.e., opening 114' is not positioned entirely over contact pad 110) it is possible that the subsequent electrical connection to contact pad 110 will not be achieved. Alternatively, if the desired opening 114' exceeds the maximum tolerable displacement D by several micrometers, an insufficient or unacceptable electrical connection to contact pad 110 will be formed. Thus, it is desirable to accurately locate and form all openings 114 over all contact pads 110 within the maximum tolerable displacement distance D.

Figure 4:
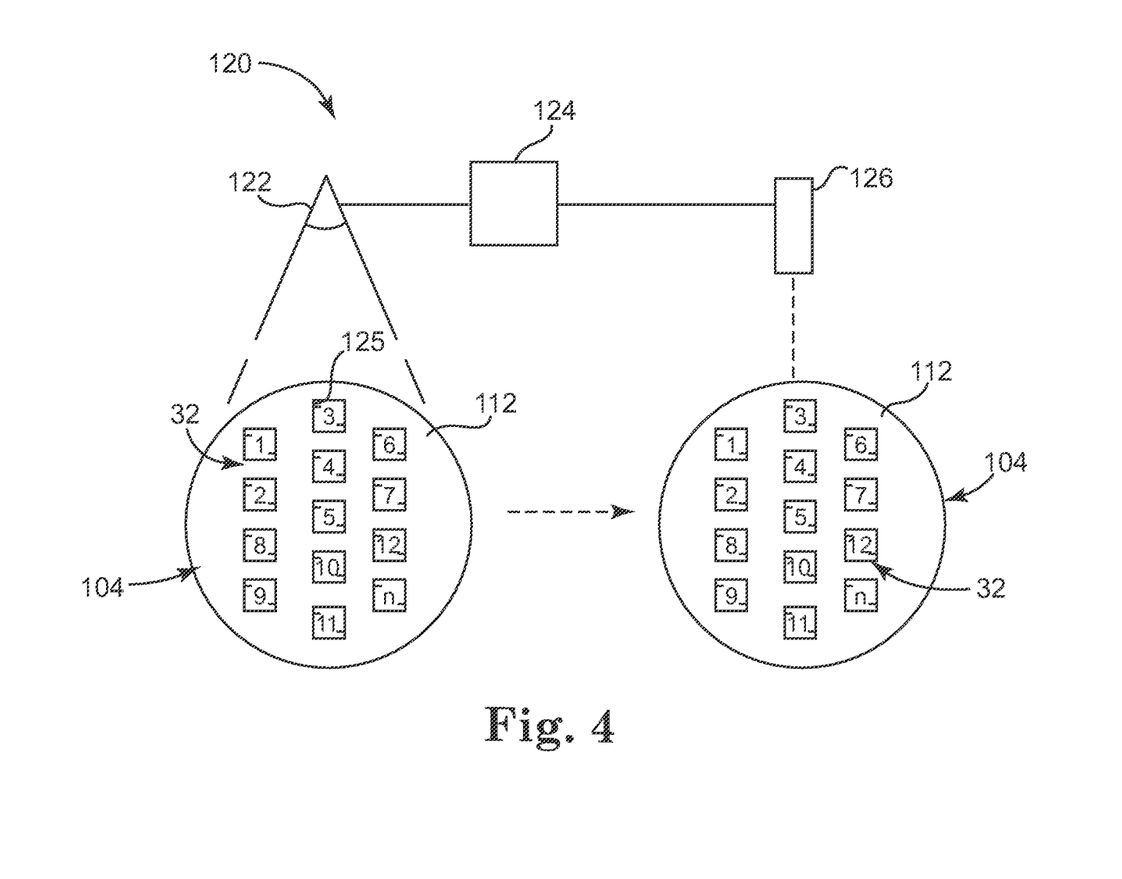
FIG. 4 is a schematic view of a system including an optical scanner and a photolithographic stepper employed to fabricate semiconductor packages according to one embodiment.

FIG. 4 is a schematic view of a system 120 configured to expedite processing of semiconductor packages according to one embodiment. System 120 includes a scanner 122 in electrical communication with a photolithographic stepper 126. Scanner 122 is configured to measure the positions of semiconductor dies 32, calculate an exposure matrix for a reconfigured wafer 104, and provide this data to stepper 126. In one embodiment, scanner 122 is in electrical communication with an optional computer 124 operating software that is configured to store the measured position data of the dies 32, calculate the exposure matrix and/or location for stepper 126, and communicate this information to stepper 126.

In one embodiment, scanner 122 is a Nikon VMR3020 optical scanner available from Nikon USA Melville, N.Y. and configured to measure a position of each of the dies 32. In one embodiment, the dies 32 include marks 125 (e.g., located on two corners of each die 32) that are optically visible by scanner 122. Scanner 122 is configured to calculate the amount of rotation or misplacement of each of the dies, and specifically, to measure and calculate the relative positions of each die 32. In one embodiment, the scanner 122 measures the relative and individual location of each die 32 on reconfigured wafer 104. In one embodiment, scanner 122 measures and records the relative location of multiple dies (for example between 8-20 dies) in a stepfield group. After measuring the relative position of dies 32, scanner 122 in one embodiment calculates an optimum exposure position for each of the dies 32 in one stepping field of the stepper and for all stepping positions and transfers this information to stepper 126.

In one embodiment, computer 124 includes memory and software that are configured to receive the location data and calculate an exposure matrix for stepper 126 relative to reconfigured wafer 104. Computers including any suitable memory and configured to operate computer executable functions are acceptable.

In one embodiment, stepper 126 is a photolithographic stepper available from Ultratech of San Jose, Calif. Other photolithographic steppers are also acceptable. The desired pattern to be formed on each of the dies as measured by scanner 122 is reproduced in a pattern of transparent and opaque areas on a surface of a quartz plate (a photo mask or reticle). Stepper 126 passes light through the reticle to form an image of the reticle pattern on each of the dies 32. The image is focused and reduced by a lens and projected onto the surface of each of the dies 32 (or the dielectric 112 covering the dies 32). Those of skill in the photolithographic art will recognize that dies 32 are covered with a dielectric material of a suitable photosensitive photoresist.

After exposure by stepper 126, the reconfigured wafer 104 is developed to remove the photoresist and form openings to contact pads 110 of each die 32. In one embodiment, stepper 126 is aligned only one time relative to reconfigured wafer 104 after receiving the calculated data from scanner 122. Thereafter, stepper 126 subsequently moves across each of the dies 32 or exposes all dies 32 without having to re-align or be re-aligned a second time. In this manner, stepper 126 is enabled by system 120 to locate every die 32 on wafer 42, align with wafer 104 one initial time and expose the dies 32 based on the scanned position data, even though the relative position of the dies 32 may be misaligned.

In contrast, the known photolithographic steppers locate each die or small groups of dies separately for every die or small groups on a wafer, expose the die or small groups of dies, and then repeat this process for each subsequent die or small groups of dies, which is time consuming and process-limiting.

Figure 5:
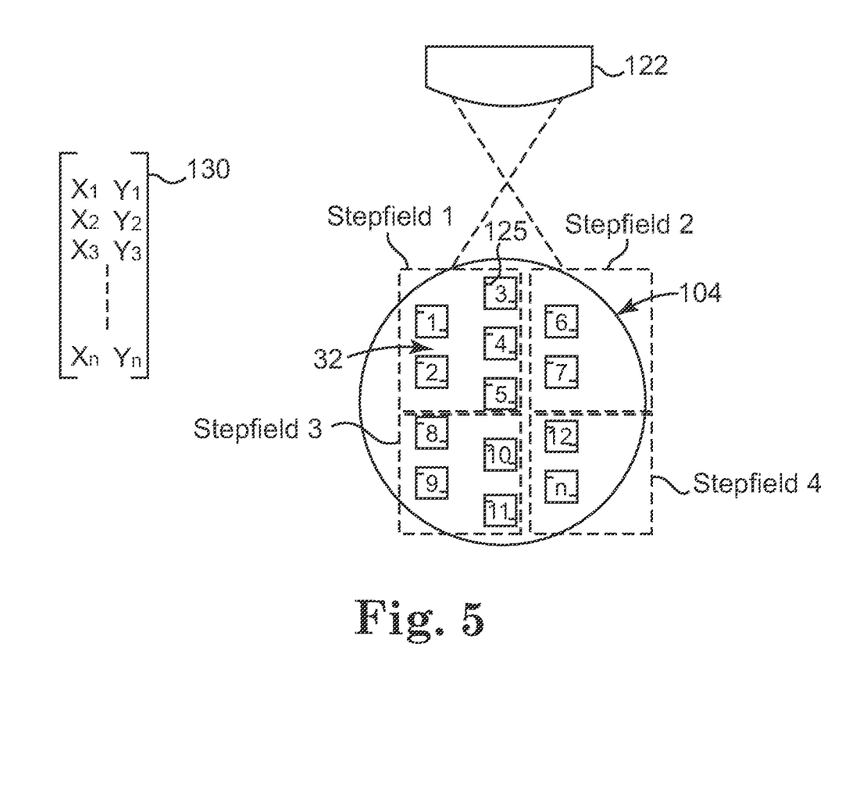
FIG. 5 is a schematic view of stepfields formed by the optical scanner illustrated in FIG. 4 according to one embodiment.

FIG. 5 is a schematic view of exemplary stepfields 1-4 generated by scanner 122 in measuring locations for each of dies 32. In one embodiment, scanner 122 employs software (not shown) configured to divide reconfigured wafer 104 into multiple stepfields. As an example, stepfield 1 includes dies 1, 2, 3, 4, and 5; stepfield 2 includes dies 6 and 7; stepfield 3 includes dies 8, 9, 10, and 11; and stepfield 4 includes dies 12, . . . , n. The number and size of stepfield(s) is not limited. In one embodiment, reconfigured wafer 104 is segregated into multiple stepfields of approximately 8-24 dies each, although other stepfield sizes are also acceptable.

Scanner 122 optically captures/measures a location of each die 32, for example by recognizing a mark 125 located on dies 32, and generates die position location information X1, Y1; X2, Y2; . . . , Xn, Yn that is stored in an electronically accessible data field 130. In one embodiment, scanner 122 optically captures/measures a location of each die 32 in stepfield 1 before capturing/measuring the locations of dies in stepfield 2. In one embodiment, scanner 122 optically captures/measures a location of each die 32 in all stepfields 1-4.

In one embodiment, scanner 122 generates data field 130 and transfers data field 130 to computer 124 for calculation of the desired exposure distance for stepper 126 (FIG. 4). In one embodiment, scanner 122 generates data field 130 and calculates an exposure distance to the reconfigured wafer 104 prior to transferring this information to stepper 126.

Figure 6:
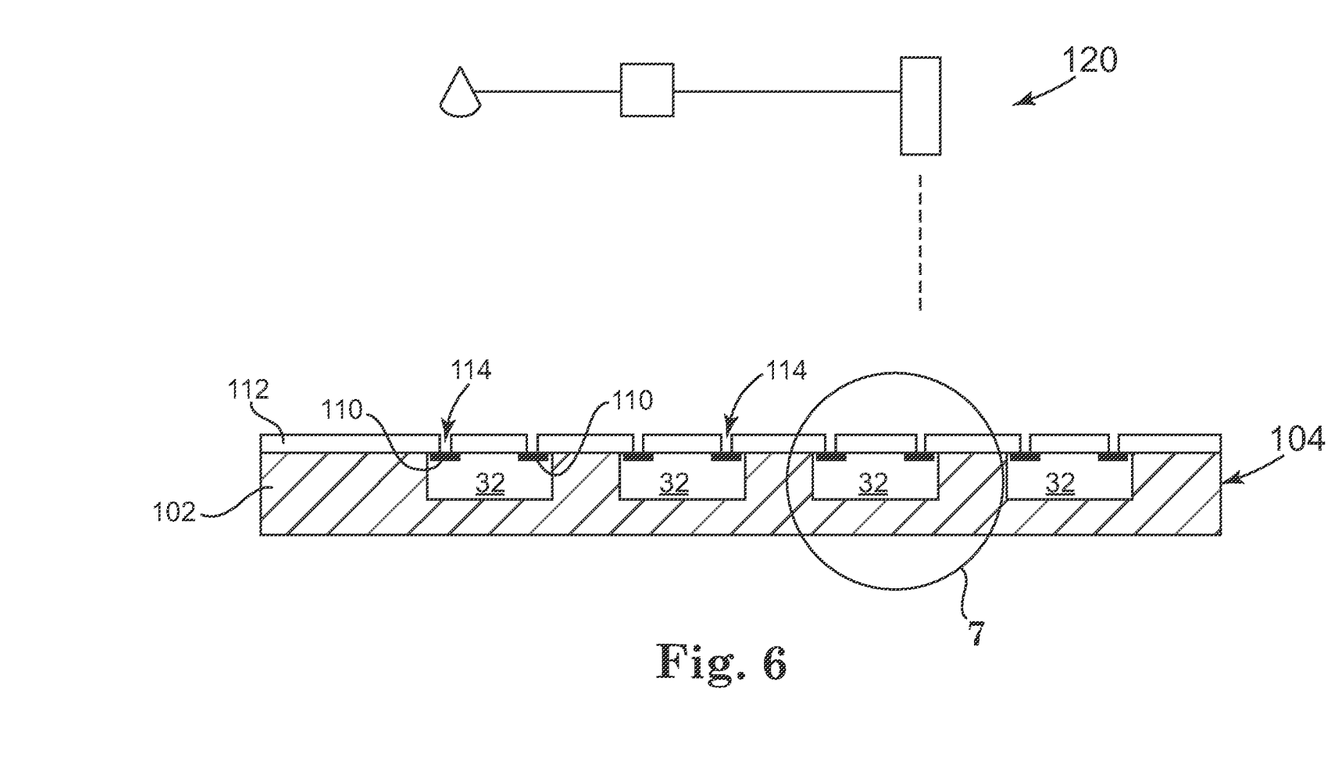
FIG. 6 is a cross-sectional view of dies embedded in a fan-out molded material and including a dielectric that has been opened to form electrical communication paths to each die according to one embodiment.

FIG. 6 is a cross-sectional view of reconfigured wafer 104 according to one embodiment. Dies 32 include contact pads 110 and openings 114 formed in dielectric 112 communicating with contact pads 110. In one embodiment, system 120 is employed to sequentially move stepper 126 from one die to the next to photolithographically form openings 114 that are aligned above contact pads 110 within the maximum tolerable displacement distance D (FIG. 3).

FIGS. 7A-7H illustrate multiple schematic cross-sectional views of embodiments of the system 120 illustrated in FIG. 4 employed to pattern layers in a semiconductor package. Embodiments include employing system 120 to pattern a resist layer over dielectric layer 112, and pattern a redistribution layer into the resist layer, as described below. Embodiments additionally include employing system 120 to pattern a solder resist layer over the redistribution layer to form openings for solder ball interconnects, as described below.

Figure 7A:
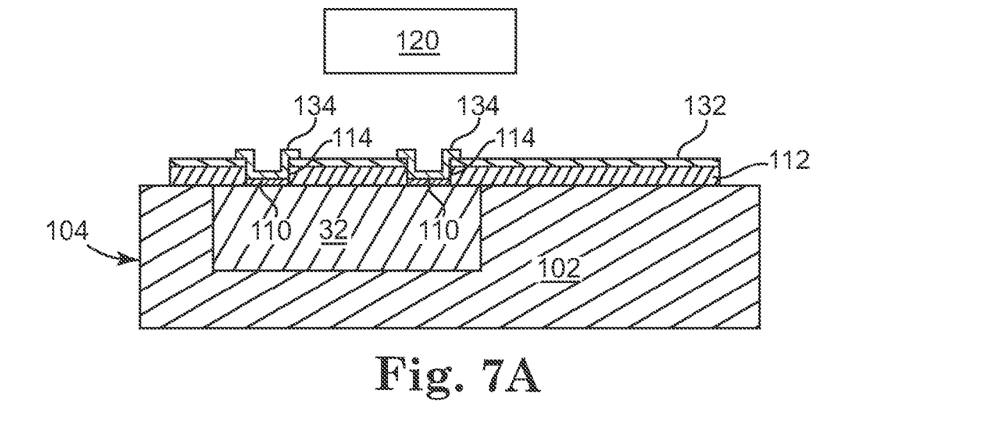
FIGS. 7A-7H illustrate multiple schematic cross-sectional views of embodiments of the system illustrated in FIG. 4 employed to pattern layers in a semiconductor package.

FIG. 7A is a cross-sectional view of system 120 described above employed to pattern a conductor 132 on dielectric 112 and pattern a conductive layer 134 into openings 114. In one embodiment, conductor 132 and conductive layer 134 are deposited concurrently. In one embodiment, no conductor 132 is applied to dielectric 112 when fabricating the intermediate product of FIG. 7A and conductive layer 134 is applied to the whole upper surface of dielectric 112, including into the through-holes 114 to electrically communicate with contact pads 110. In one embodiment, conductor 132 is patterned by system 120 to form a target to receive conductive layer 134.

Figure 7B:
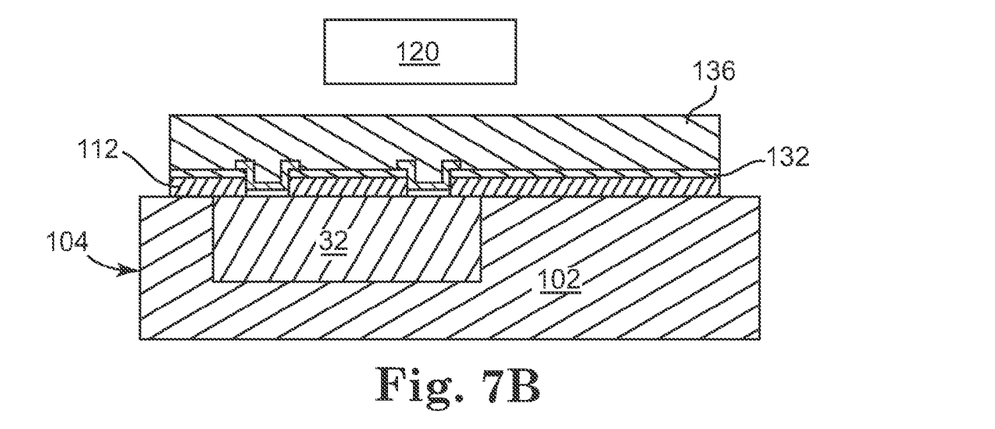

FIG. 7B is a cross-sectional view of system 120 described above employed to pattern a resist layer 136 onto the upper surface of conductor 132 and into the through-hole openings 114 of dielectric 112. Suitable resist layers 136 include a dry resist or a sprayed resist having a thickness between 10 μm-30 μm. For example, in one embodiment resist layer 136 has a thickness of about 15 μm. In one embodiment, resist layer 136 is a dry resist that is laminated on the surface of conductor 132.

Figure 7C:
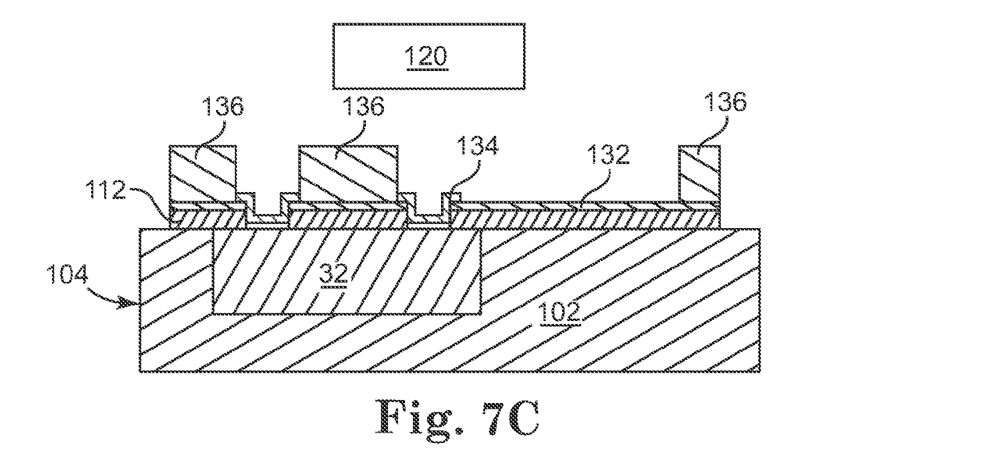

FIG. 7C is a cross-sectional view of system 120 described above employed to pattern and photolithographically expose and develop resist layer 136. In one embodiment, resist layer 136 is exposed with a laser direct imaging (LDI) process or other imaging method, the pattern of which is based on the die position data field 130 generated/collected by scanner 122 (FIG. 5). After developing of the resist layer 136, a predetermined portion of resist layer 136, as calculated by data field 130, is removed to open up electrically conductive contact areas over conductor 132 and conductive layer 134.

Figure 7D:
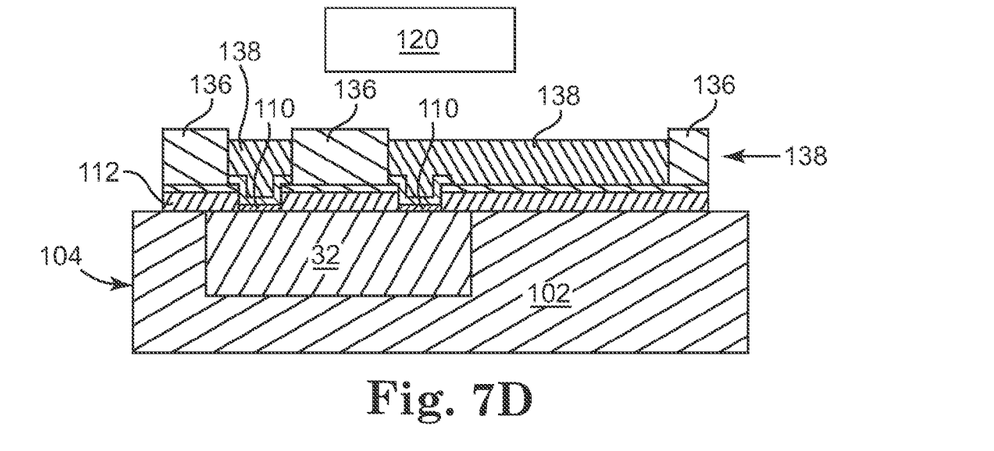

FIG. 7D is a cross-sectional view of system 120 described above employed to pattern contacts 138 into the remaining portions of through-hole openings 114 and on the regions of conductor 132. In one embodiment, contacts 138 form part of a redistribution layer 138 (RDL 138) for electrically redistributing contact pads 110 to a larger area. In one embodiment, RDL 138 is fabricated by electroplating in a strong agitated electrolyte, for example. Other suitable deposition processes for RDL 138 are also acceptable, including galvanic plating, or chemical plating, or conductive printing. It is to be understood that RDL 138 may extend in a direction perpendicular to the FIG. 7 image plane.

Figure 7E:
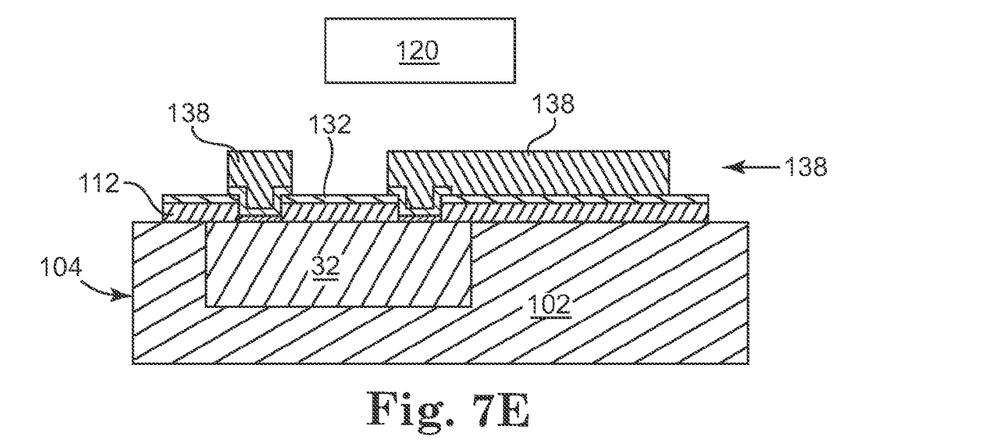

FIG. 7E is a cross-sectional view of an intermediate product fabricated after etching the remaining portions of resist layer 136 (FIG. 7D) to leave behind RDL 138.

Figure 7F:
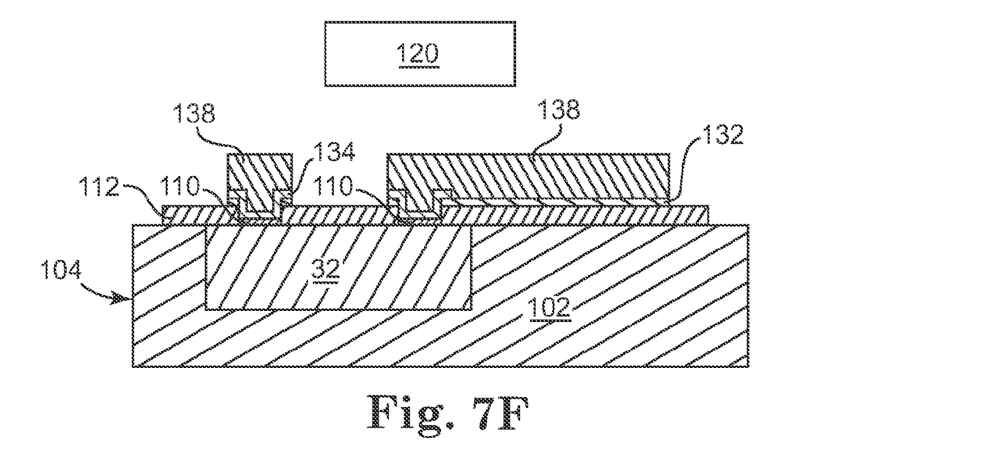

FIG. 7F is a cross-sectional view of a further intermediate product obtained after etching away a remaining exposed portion of conductor 132 (FIG. 7E) to electrically separate RDL 138 into a desired pattern across reconfigured wafer 104.

Figure 7G:
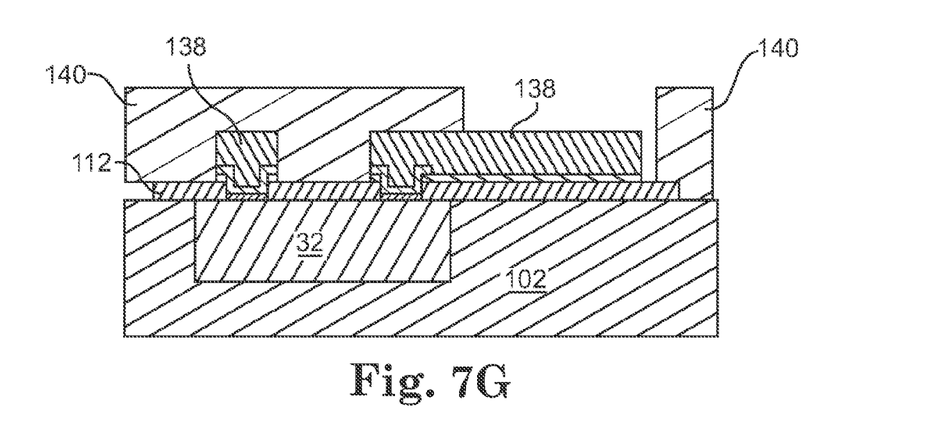

FIG. 7G is a cross-sectional view of system 120 described above employed to pattern a solder resist layer 140 over the intermediate product fabricated in FIG. 7F. In one embodiment, solder resist layer 140 is structured according to the die location data field 130 so that portions of RDL 138 are not covered by solder resist layer 140.

Figure 7H:
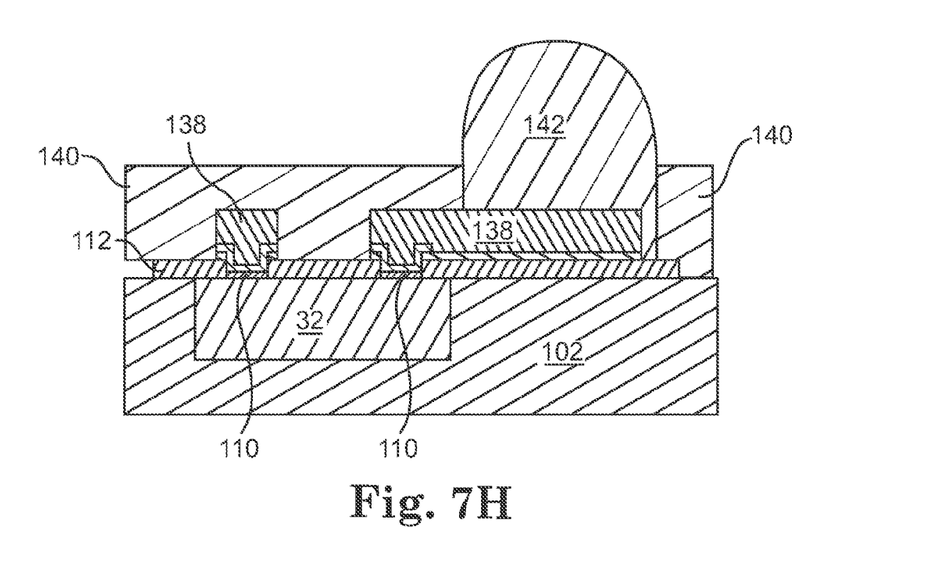

FIG. 7H is a cross-sectional view of a segment of an embedded wafer level ball grid array 150 (eWLB) fabricated by system 120 (FIG. 4) according to one embodiment. Solder balls 142 (only one of which is illustrated in this segment of eWLB) are disposed into the openings of solder resist layer 140 so that each solder ball 142 is electrically connected with RDL 138 and contact pads 110 of die 32.

Figure 8:
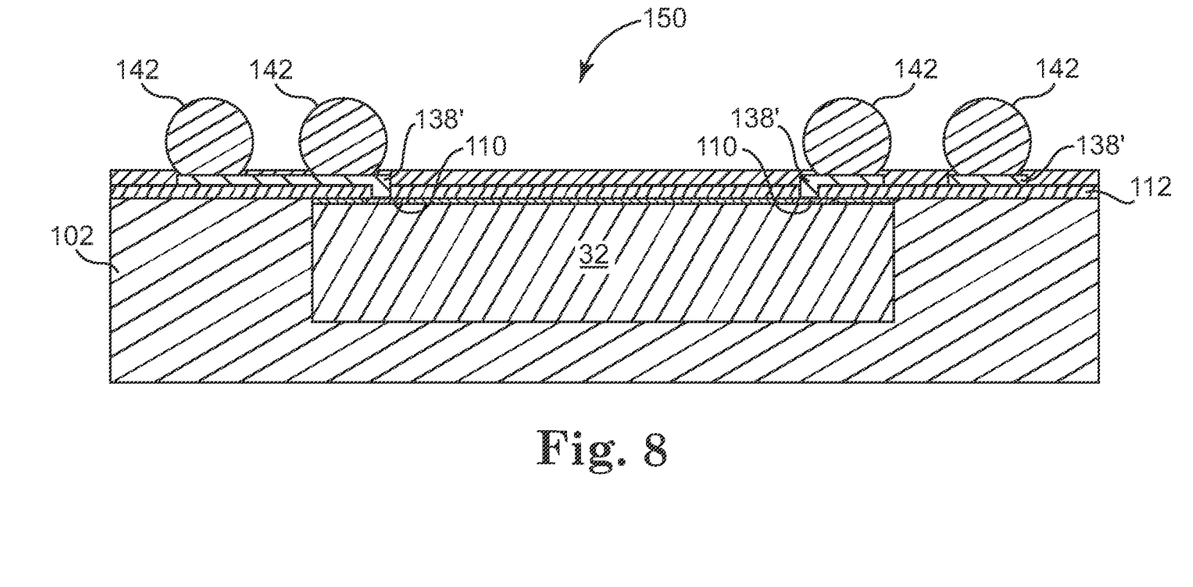
FIG. 8 is a cross-sectional view of an embedded wafer level package fabricated according to one embodiment.

FIG. 8 is a cross-sectional view of an embedded wafer level package 150 fabricated by system 120 according to another embodiment. Reconfigured wafer 104 (such as in FIG. 6) is sigulated into individual packages 150 including chip 32 embedded within mold material 102 (fan-out area). In one embodiment, system 120 is employed to pattern RDL 138' for second level interconnection with multiple solder balls 142. RDL 138' forms an electrical communication pathway to die 32. In one embodiment, second level interconnections are provided, for example, by solder balls 142 that electrically connect with RDL 138' to provide vertical interconnection for chip 32.

Embodiments provide a fast lithography process including an optical scanner 122 communicating with a stepper 126 that enables the stepper to align relative to the wafer only once to account for die shift compensation within a reconfigured wafer of semiconductor dies.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments of a system and method for processing semiconductor packages. Therefore, it is intended that this invention be limited only by the claims and the equivalents thereof.

What is claimed is:

1. A method of processing semiconductor chips, the method comprising:
   measuring locations of singulated semiconductor dies placed on a carrier with a laser scanner to generate die location information;
   encapsulating the semiconductor dies to form a reconfigured wafer on the carrier;
   communicating the die location information to a photolithographic stepper;
   aligning the photolithographic stepper with the carrier; and
   exposing at least one of the dies on the carrier with the photolithographic stepper based on the die location information generated by the laser scanner.

2. The method of claim 1, wherein the carrier comprises a reconfigured wafer including the semiconductor dies spaced apart in a fan-out configuration on the reconfigured wafer.

3. The method of claim 2, wherein at least one semiconductor dies are assigned to a stepfield and exposing at least one of the dies comprises exposing all of the semiconductor dies in the stepfield.

4. The method of claim 1, wherein exposing at least one of the semiconductor dies on the carrier comprises photolithographically opening a dielectric layer disposed over the semiconductor dies to form a pathway communicating through the dielectric layer with contact pads of the dies.

5. The method of claim 4, further comprising:
   a resist layer disposed over the dielectric layer; and
   patterning a redistribution layer into the resist layer with a system comprising the laser scanner and the photolithographic stepper.

6. The method of claim 5, further comprising:
   a solder resist layer disposed over the redistribution layer;
   patterning the solder resist with the system; and
   depositing an interconnect element in an opening patterned into the solder resist.

7. The method of claim 1, wherein the aligning the photolithographic stepper with the carrier occurs only one time.

8. The method of processing semiconductor chips, the method comprising:
   singulating dies from a wafer and redistributing the dies on a carrier;
   measuring locations of the dies redistributed on the carrier;
   encapsulating the semiconductor dies to form a reconfigured wafer on the carrier;
   aligning a photolithographic stepper with the carrier only one time; and
   photolithgraphically exposing at least one of the dies based on the measured location of the dies redistributed on the carrier.

9. The method of claim 8, wherein measuring locations of the dies redistributed on the carrier comprises optically scanning a discrete location of each of the dies.

10. The method of claim 9, comprising optically scanning a discrete location of each of the dies in a single optical scan.

11. The method of claim 9, comprising calculating separate exposure positions for each of the dies based on the discrete location of each of the dies, and communicating the calculated separate exposure positions for each of the dies to the photolithographic stepper.

12. The method of claim 11, comprising stepping the photolithographic stepper sequentially to each of the separate exposure positions for each of the dies.

13. The method of claim 9, comprising calculating an exposure matrix for the photolithographic stepper based on the optically scanned discrete location of each of the dies.

14. The method of claim 8, wherein the dies are embedded in a dielectric that is opened by photolithographically exposing at least one of the dies to provide a wafer level ball grid array comprising a redistribution layer that provides selective electrical connection to at least one of the dies.

15. The method of claim 8, wherein the dies are embedded in a redistributed chip package comprising at least two electrically conducting redistribution layers.

16. The method of claim 8, wherein photolithographically exposing at least one of the dies comprises opening a first dielectric layer to expose a contact pad of each of the dies.

17. The method of claim 16, further comprising:
   structuring a redistribution layer on the first dielectric layer, the redistribution layer contacting the contact pad of at least one of the dies.

18. The method of claim 17, wherein structuring a redistribution layer comprises:
   depositing a resist layer on the first dielectric layer;
   optically scanning the resist layer to generate position information;
   communicating the position information to the photolithographic stepper;
   aligning the photolithographic stepper relative to the resist layer only one time based on the position information;
   exposing the resist layer with the photolithographic stepper and opening the resist layer; and
   depositing the redistribution layer into openings formed in the resist layer.

19. The method of claim 18, further comprising:
   depositing a solder resist on the redistribution layer;
   optically scanning the solder resist to generate ball position information;
   communicating the ball position information to the photolithographic stepper;
   aligning the photolithographic stepper relative to the solder resist only one time based on the ball position information;
   exposing the solder resist with the photolithographic stepper and opening the solder resist; and
   depositing a solder ball into openings formed in the solder resist.

20. A method of processing semiconductor chips, the method comprising:
   measuring locations of singulated semiconductor dies placed on a carrier with a laser scanner to generate die location information;
   encapsulating the semiconductor dies to form a reconfigured wafer on the carrier;
   communicating the die location information to a patterning system;
   aligning the patterning system with the carrier; and opening at least one of the semiconductor dies on the carrier with the patterning system based on the die location information generated by the laser scanner.

21. The method of claim 20, wherein the carrier comprises a reconfigured wafer including the semiconductor dies spaced apart in a fan-out configuration on the reconfigured wafer.

22. The method of claim 20, wherein at least one of the semiconductor dies is assigned to a stepfield and exposing at least one of the semiconductor dies comprises exposing all of the semiconductor dies in the stepfield.

23. The method of claim 20, wherein opening at least one of the semiconductor dies on the carrier comprises laser opening a dielectric layer disposed over the semiconductor dies to form a pathway communicating through the dielectric layer with contact pads of the dies.

\* \* \* \* \*

UNITED STATES PATENT AND TRADEMARK OFFICE
CERTIFICATE OF CORRECTION

PATENT NO. : 9,164,404 B2  
APPLICATION NO. : 12/234259  
DATED : October 20, 2015  
INVENTOR(S) : Meyer Page 1 of 1

It is certified that error appears in the above-identified patent and that said Letters Patent is hereby corrected as shown below:

On the title page item (73) Assignee: delete "Intel Corporation, Santa Clara, CA (US)", insert
-- INTEL DEUTSCHLAND GMBH, DE --.

Signed and Sealed this  
Twenty-ninth Day of March, 2016

Michelle K. Lee  
*Director of the United States Patent and Trademark Office*